United States Patent
Fugere et al.

(10) Patent No.: US 9,520,870 B2
(45) Date of Patent: Dec. 13, 2016

(54) SYSTEMS AND METHODS FOR PULSE WIDTH MODULATED CONTROL OF A SEMICONDUCTOR SWITCH

(71) Applicants: Semiconductor Components Industries, LLC, Phoenix, AZ (US); Conti Temic Microelectronic GmbH, Nürnberg (DE)

(72) Inventors: Robert H. Fugere, North Providence, RI (US); Andrew Talan, West Greenwich, RI (US); Daniel P. Connolly, East Bridgewater, MA (US); Uli Joos, Markdorf (DE); Norbert Stuhler, Ravensburg (DE)

(73) Assignees: Semiconductor Components Industries, LLC, Phoenix, AZ (US); Conti Temic Microelectronic GmbH, Nürnberg (DE)

( * ) Notice: Subject to any disclaimer, the term of this patent is extended or adjusted under 35 U.S.C. 154(b) by 0 days.

(21) Appl. No.: 14/670,818

(22) Filed: Mar. 27, 2015

(65) Prior Publication Data

US 2016/0285448 A1    Sep. 29, 2016

(51) Int. Cl.
*H03K 3/00* (2006.01)
*H03K 17/16* (2006.01)
*H03K 19/173* (2006.01)

(52) U.S. Cl.
CPC ........ *H03K 17/165* (2013.01); *H03K 19/1733* (2013.01)

(58) Field of Classification Search
USPC ........................................ 327/109
See application file for complete search history.

(56) References Cited

U.S. PATENT DOCUMENTS

| | | | |
|---|---|---|---|
| 4,799,165 A | 1/1989 | Hollister et al. | |
| 4,954,758 A | 9/1990 | Rusk | |
| 7,180,337 B2 | 2/2007 | Feldtkeller | |
| 2004/0008016 A1 | 1/2004 | Sutardja | |
| 2004/0125623 A1 | 7/2004 | Sankman et al. | |
| 2009/0119519 A1 | 5/2009 | McDonald et al. | |
| 2009/0160500 A1* | 6/2009 | Niculae ................. | H02M 1/08 327/109 |
| 2011/0266969 A1* | 11/2011 | Ludorf ................ | H02M 1/4258 315/294 |
| 2012/0039098 A1 | 2/2012 | Berghegger | |

(Continued)

FOREIGN PATENT DOCUMENTS

CA    2769814 A1    8/2013

*Primary Examiner* — Lincoln Donovan
*Assistant Examiner* — Patrick Chen
(74) *Attorney, Agent, or Firm* — Adam R. Stephenson, LTD.

(57) ABSTRACT

Pulse width modulated controller systems. Implementations may include: a microcontroller coupled with a memory, a switch controller coupled with the microcontroller, and a calibration unit. The calibration unit may include one or more comparators, one or more passive electrical components, and an encoder logic all operatively coupled together and coupled with the microcontroller and with the switch controller where the at least one comparator and the one or more passive electrical components are electrically coupled with a supply voltage to the semiconductor switch and with a load voltage (output voltage) from the semiconductor switch.

16 Claims, 5 Drawing Sheets

(56) References Cited

U.S. PATENT DOCUMENTS

2014/0132236 A1* 5/2014 Darmawaskita ...... H02M 3/156
  323/283
2014/0354258 A1  12/2014 Thomsen
2015/0062108 A1  3/2015 Archibald

* cited by examiner

Prior Art

SYSTEMS AND METHODS FOR PULSE WIDTH MODULATED CONTROL OF A SEMICONDUCTOR SWITCH

BACKGROUND

1. Technical Field

Aspects of this document relate generally to systems and methods for controlling switches. More specific implementations involve systems and methods for controlling semiconductor switches.

2. Background Art

A wide variety of electronic switches have been devised. Conventional switch designs typically include a circuit interrupting/controlling component. In conventional automatic switches, the circuit interrupting/control component is governed by a control circuit. Semiconductor devices such as metal oxide field effect transistors (MOSFETs) and insulated-gate bipolar transistors (IGBTs) can be used as circuit interrupting/control components.

SUMMARY

Implementations of pulse width modulated controller systems may include: a microcontroller coupled with a memory, a switch controller coupled with the microcontroller, and a calibration unit. The calibration unit may include at least one comparator, one or more passive electrical components, and an encoder logic all operatively coupled together and coupled with the microcontroller and with the switch controller. The at least one comparator and the one or more passive electrical components may be electrically coupled with a supply voltage to the semiconductor switch and with a load voltage (output voltage) from the semiconductor switch.

Implementations of pulse width modulated controller systems may include one, all, or any of the following:

The switch controller may include a control logic and a memory operatively coupled together and operatively coupled with a semiconductor switch.

The memory coupled to the microcontroller may include a digitally stored model including one or more control parameters for generating a control signal for the semiconductor switch.

The memory coupled to the microcontroller includes a look-up table including one or more model parameters for use by the microcontroller to calculate one or more control parameters for generating a control signal for the semiconductor switch.

The microcontroller may be configured to receive one or more operating condition parameters and, using one or more operating condition parameters and the digitally stored model, to generate the control signal for the semiconductor switch.

The system may include at least two comparators. The microcontroller may be configured to send a calibration trigger signal to the encoder logic of the calibration unit and, in response, the calibration unit may be configured to: using a first one of the at least two comparators, generate a first comparator output for a switching-on operation of the semiconductor switch; using a second one of the at least two comparators, generate a second comparator output for a switching-off operation of the semiconductor switch; generate a status signal using the encoder logic using one of the first comparator output, the second comparator output, or both the first comparator output and the second comparator output; and send the status signal to the microcontroller.

The microcontroller may be further configured to, in response to receiving the status signal, adjust one or more of the one or more control parameters of the digital model stored in the memory coupled to the microcontroller.

The microcontroller may be configured to generate the calibration trigger signal on a predetermined time interval.

The microcontroller may be configured to generate the calibration trigger signal after analyzing one of a current value of one or more operating condition parameters or a development of values of one or more operating condition parameters over a period of time.

The microcontroller may not be configured to generate the calibration trigger signal after each switching operation of the semiconductor switch.

The switch controller may further include a serial peripheral interface (SPI), a control logic, a gate driver, and a charge pump all operatively coupled together and operatively coupled with the semiconductor switch.

Implementations of a pulse width modulated controller system may include a microcontroller coupled with a memory where the memory includes a look-up table including one or more model parameters. The system may include a switch controller coupled with the microcontroller and with a semiconductor switch where the switch controller includes a control logic. A calibration unit may also be included that includes at least one comparator, one or more passive electrical components, and an encoder logic all operatively coupled together and coupled with the microcontroller and with the switch controller. The at least one comparator and the one or more passive electrical components may be electrically coupled with a supply voltage to the semiconductor switch and with a load voltage from the semiconductor switch. The microcontroller may be configured to receive one or more operating condition parameters and, using one or more operating condition parameters and the look-up table, to generate control parameters for generating the control signal for the semiconductor switch.

Implementations of a pulse width modulated controller system may include one, all, or any of the following:

The system may include at least two comparators. The microcontroller may be configured to send a calibration trigger signal to the encoder logic of the calibration unit, and, in response, the calibration unit may be configured to: using a first one of the at least two comparators, generate a first comparator output for a switching-on operation of the semiconductor switch; using a second one of the at least two comparators, generate a second comparator output for a switching-off operation of the semiconductor switch; generate a status signal using the encoder logic using one of the first comparator output, the second comparator output, or both the first comparator output and the second comparator output; and send the status signal to the microcontroller.

The microcontroller may further be configured to, in response to receiving the status signal, change one or more of the one or more model parameters included in the look-up table stored in the memory coupled to the microcontroller.

The microcontroller may be configured to generate the calibration trigger signal on/at a predetermined time interval.

The microcontroller may be configured to generate the calibration trigger signal after analyzing one of a current value of the one or more operating condition parameters or a development of values of the one or more operating condition parameters over a period of time.

The microcontroller may not be configured to generate the calibration trigger signal after each switching operation of the semiconductor switch.

Implementations of pulse width modulation controller systems may utilize implementations of a method of controlling a semiconductor switch. The method may include storing one or more model parameters in a look-up table included in memory coupled with a control logic and with a microcontroller and receiving one or more operating condition parameters using the microcontroller. In response to receiving one or more operating condition parameters, the method may include retrieving one or more of the one or more model parameters in the look-up table and generating one or more control parameters using the microcontroller and using the one or more operating condition parameters. The method may also include generating a control signal for a semiconductor switch using the one or more control parameters and the control logic and providing a calibration trigger signal to a calibration unit using the microcontroller. In response to receiving the calibration trigger signal, the method may include evaluating a switching-on operation of the semiconductor switch using at least one comparator and one or more passive electrical components included in a calibration unit coupled with the microcontroller by generating a switching-on output through computing a value of an output voltage from the semiconductor switch with a predetermined switching-on voltage. In response to receiving the calibration trigger signal, the method may include evaluating a switching-off operation of the semiconductor switch using the at least one comparator and the one or more passive electrical components included in the calibration unit coupled with the microcontroller by generating a switching-off output through comparing a value of the output voltage from the semiconductor switch with a predetermined switching-off voltage. The method may also include using an encoder logic included in a calibration unit coupled with the microcontroller to generate a status signal using one of the switching-on output, the switching-off output, or both the switching-on output and the switching-off output and sending the status signal to the microcontroller. In response to receiving the status signal, the method may include evaluating whether the data representing the output voltage in the status signal is outside a predetermined voltage window using the microprocessor. If the output voltage is outside the predetermined voltage window, the method may include changing one or more of the one or more model parameters included in the look-up table included in the memory coupled to the microcontroller using the microcontroller in response to receiving the calibration signal.

Implementations of the method may include one, all, or any of the following:

The microcontroller may be configured to provide the calibration trigger signal after analyzing one of a current value of the one or more operating condition parameters or a development of values of the one or more operating condition parameters over a period of time.

The microcontroller may not be configured to provide the calibration trigger signal after each switching operation of the semiconductor switch.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended pulse width modulated semiconductor switching systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such pulse width modulated semiconductor switching systems, and implementing components and methods, consistent with the intended operation and methods.

Figure 1:
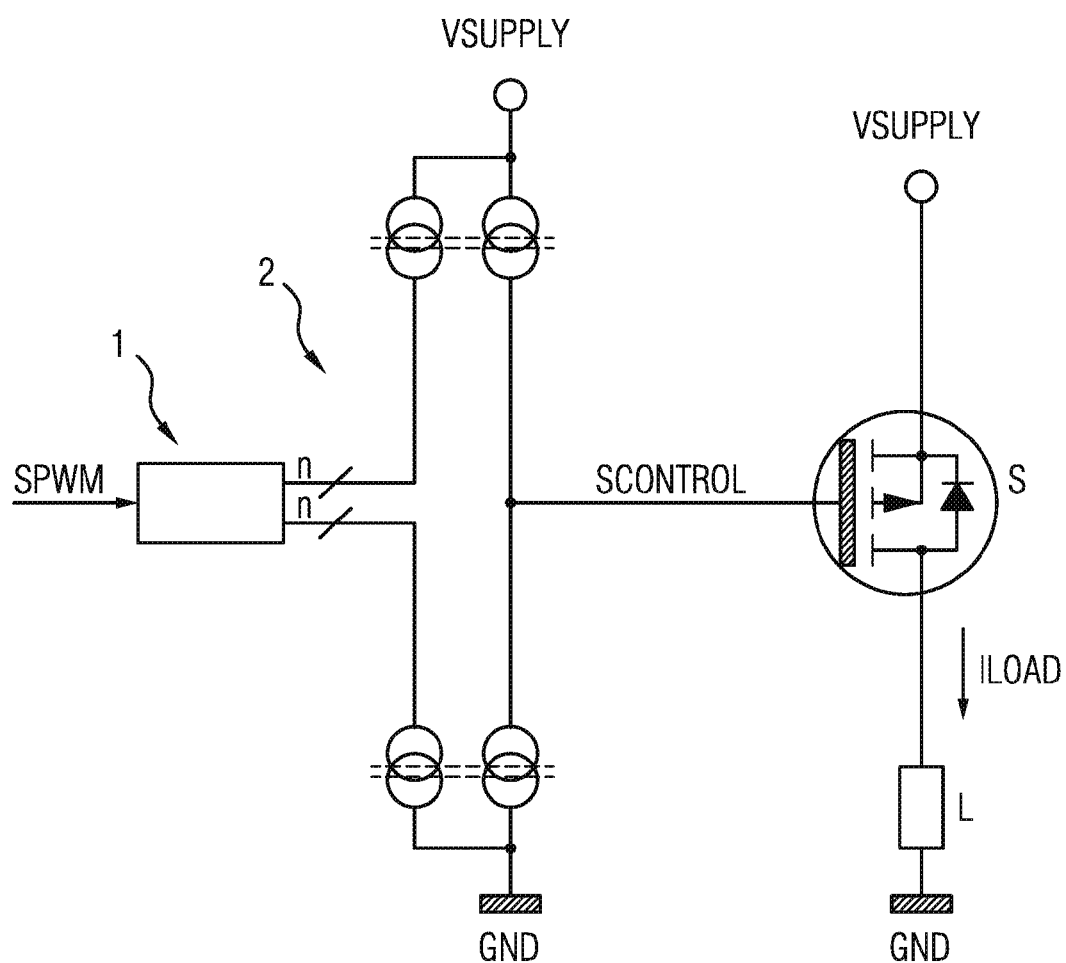
FIG. 1 is a block diagram of a conventional semiconductor switch driver system.

Referring to FIG. 1, an implementation of a conventional system that utilizes pulse width modulated (PWM) power control of a semiconductor switch supplying power to an electrical load L (e.g. electrical motor, light, etc.) as directed by an input PWM signal (SPWM). The electrical load L is arranged in series to a source-drain path (load path) of a metal oxide semiconductor field effect transistor (MOSFET) switch S (semiconductor switch). In this implementation the load current ILOAD flows from a first supply terminal VSUPPLY via the MOSFET S and the load L to a second supply terminal GND, where the load current ILOAD is PWM controlled via switching-on and switching-off the MOSFET S in response to the MOSFET S receiving a sequence of pulse width modulated control signals (control signal) SCONTROL to a gate terminal (control terminal) of the MOSFET S.

The conventional gate driver system in the implementation illustrated in FIG. 1 of includes a slewrate shaping unit 1 to which the PWM signal SPWM is applied, and a charge pump unit 2 which is driven by the slew rate shaped output signal generated by the slewrate shaping unit 1 in response to receiving the PWM signal SPWM which then generates the control signal SCONTROL. The control signal SCONTROL then controls (drives) the gate of the MOSFET S. In the implementation illustrated in FIG. 1, the slewrate shaping unit 1 creates a predetermined flattening of the switching edges that occur in the load current ILOAD by generating the control signal SCONTROL according to a time profile of the control signal SCONTROL for each switching-on and switching-off operation. The time profile has two or more phases in which the control signal SCONTROL has different intensities and/or slopes. For example, the time profile in the system of FIG. 1 can include at least a precharge phase and a subsequent slew rate phase. The precharge phase is an initial portion of the control signal which has a relatively high current to achieve a short turn-on time for the semiconductor switch S (short turn-on delay time). Use of a precharge phase may minimize switch device stress in case of the existence of an overload condition in the overall system. The subsequent slew rate phase operates at a lower current from the precharge phase. Driving the semiconductor switch S at a lower current may create a desired switching voltage slope and, correspondingly, an electromagnetic compatibility (EMC-compliant) switching operation behavior.

The time profile of the control signal SCONTROL is created by the slew rate shaping unit 1 and charge pump unit 2 implementing one or more predetermined control signal parameters which are used to generate the current duration, current intensity, and/or current slope of the control signal values within specific periods of time (phases).

Another example of a conventional PWM semiconductor switching system is found in U.S. Pat. No. 7,180,337 to Martin Feldtkeller entitled "Method for switching driving of a semiconductor switching element," issued Feb. 20, 2007, the disclosure of which is hereby incorporated entirely herein by reference. In this system, the control signal parameters that are used to define the time profile of the control signal are changed using a closed-loop control system. In this system, during each switching operation of the semiconductor switch, a determination of a possible deviation between a predetermined theoretical switching behavior of the semiconductor switching element and an actual switching behavior of the semiconductor switching element is made. Based on the calculated deviation, at least one of the one or more predetermined control signal parameters is changed for a next switching operation. The reason why adjustment of the control parameters is done in the conventional system is because the actual switching behavior of the semiconductor switch varies according to the characteristics of the switch and the operating conditions (the current or voltage being applied by the voltage). If on-board control was not used, the duty cycle of the PWM signal would vary significantly from the desired value and it would be difficult to properly respond to any detected switch overload conditions and implement overload protection measures. This increases the risk that the switching element will be stressed to failure and makes the potential reliability of the switching system lower.

In conventional closed-loop control switching systems like that described in the '337 patent that the detection of a deviation, the evaluation of such deviation, and the subsequent changing of control signal parameters from a switching operation to the next switching operation requires fast operating electronics. Accordingly, the control electronics must be integrated in close proximity to the switching element. Furthermore, because closed-loop control is used, some settling time is required before the control system has calculated the control signal parameter needed to properly control the semiconductor switch S. Since typical PWM periods are often shorter than 100 μs, the settling time period may interfere with conventional systems' ability to generate and implement control parameters needed to control the semiconductor switch S in the face of changing operating conditions. As a result, since the switching process of the MOSFET S depends not only on the time profile of the control signal SCONTROL, but also on arbitrary parameters of the MOSFET S itself and on the operating conditions, when the system cannot keep up by changing control parameters quickly enough, a large spread in the actual time profile behavior of the switch from the desired behavior may be observed, particularly where the control current to the gate terminal is kept at a lower levels to achieve EMC-compliant switching speeds.

One of the aspects of implementations of PWM switching systems disclosed herein is the use of a feedforward control system to change the control parameters. Another aspect of the PWM switching system implementations disclosed herein is the use of stored digital models of the system in calculating the control parameters which reduces the need to use fast operating electronics to try to keep up with the changes in the control signal SCONTROL during changing operating conditions.

Figure 2:
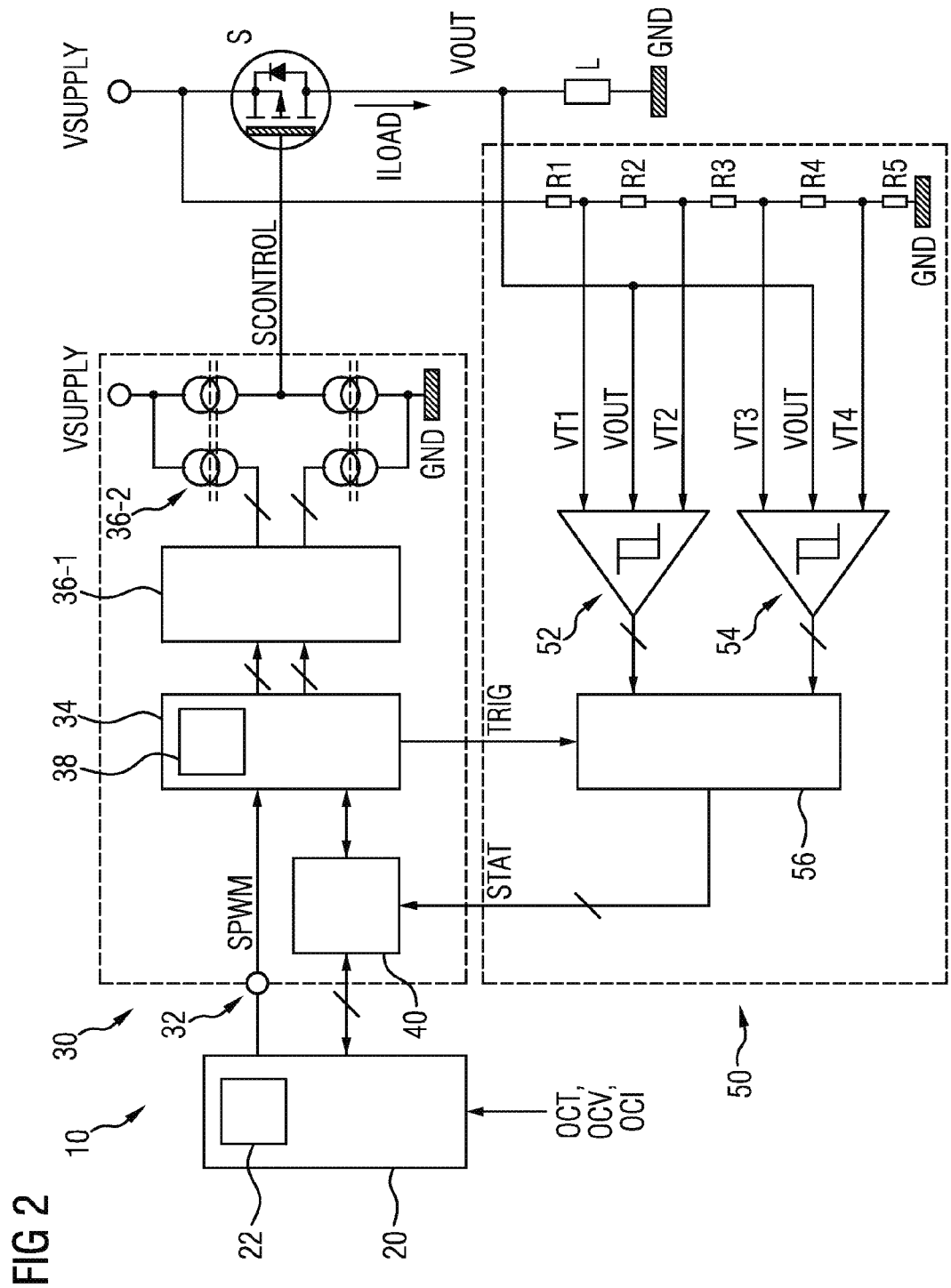
FIG. 2 is a block diagram of a implementation of a system using pulse width modulation for a semiconductor switch.

Referring to FIG. 2, an implementation of a PWM switching system is illustrated. The controlling system 10 is used to implement PWM control of a semiconductor switch S using a PWM signal SPWM. In various implementations, the system 10 may be installed in a vehicle, in which an electrical load L (such as a motor for driving a vehicle seat or a vehicle mirror, etc.) is arranged in series with the semiconductor switching element S. In various implementations, the semiconductor switching element S (in the case of a MOSFET) includes a control terminal (gate terminal) and a load path (source-drain path), and has a switching state that is a function of a charge stored on a control electrode (in the case of the MOSFET, the gate electrode). In other implementations, integrated bipolar junction transistor (IGBTs) containing semiconductor switches may be used and operated similarly to MOSFET switches.

The system 10 includes a microcontroller 20, which can be referred to as master unit that generates PWM signal SPWM. As illustrated, the system 10 also includes a switch controller 30, which receives the PWM signal SPWM at an PWM input terminal 32 and generates the control signal SCONTROL an applies the control signal to control terminal (gate) of the semiconductor switch S. Through PWM input terminal 32, the switch controller 30 receives PWM signal SPWM on a time basis to perform switching-on operations and switching-off operations with the semiconductor switching element S as directed by the PWM signal SPWM.

Figure 3:
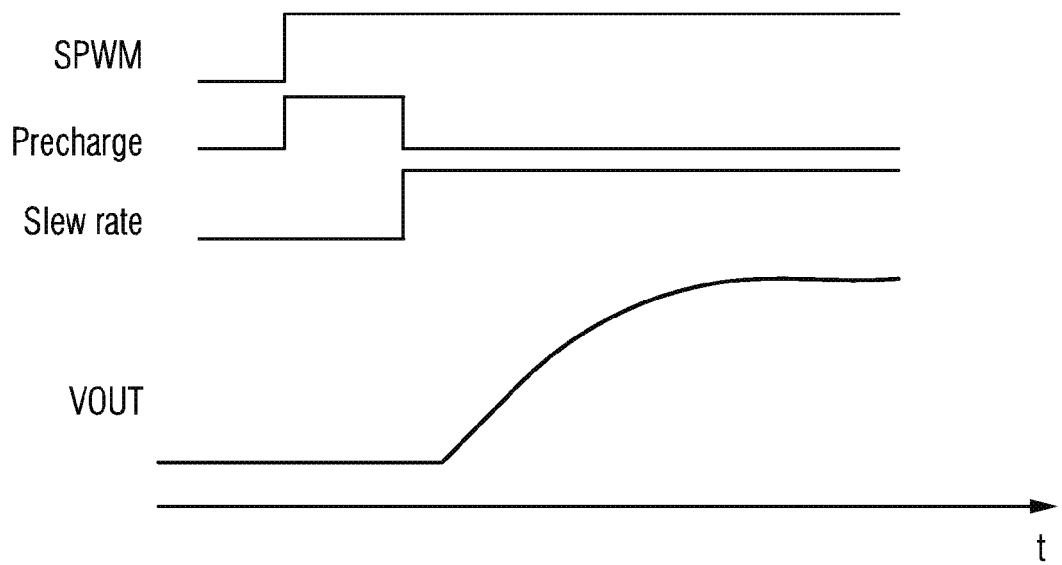
FIG. 3 is a timing diagram for a switching-on operation of a semiconductor switch like that illustrated in FIG. 2.
Figure 4:
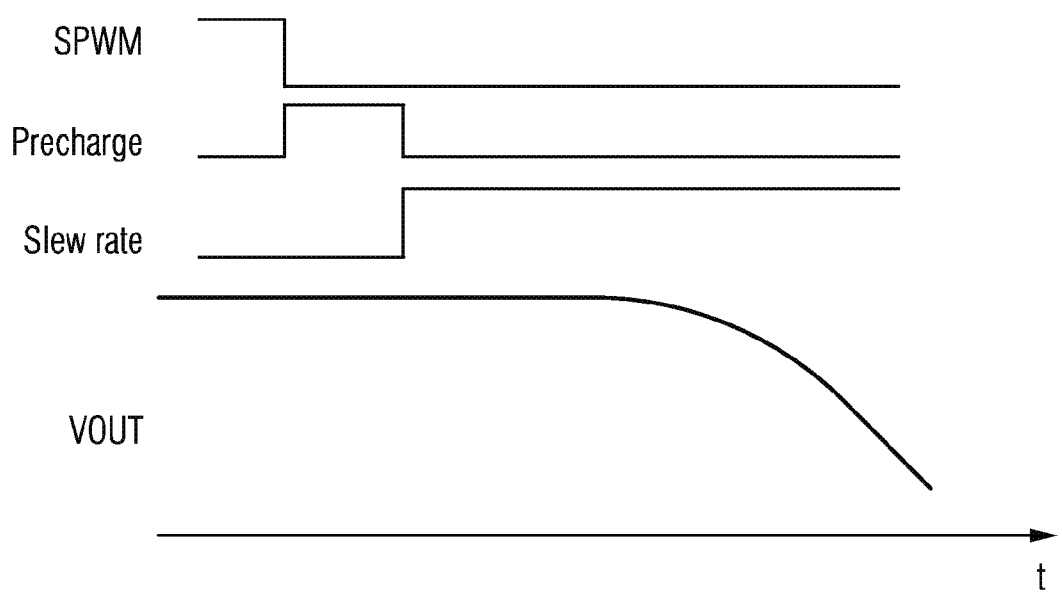
FIG. 4 is a timing diagram for a switching-off operation of a semiconductor switch like that illustrated in FIG. 2.
Figure 5:
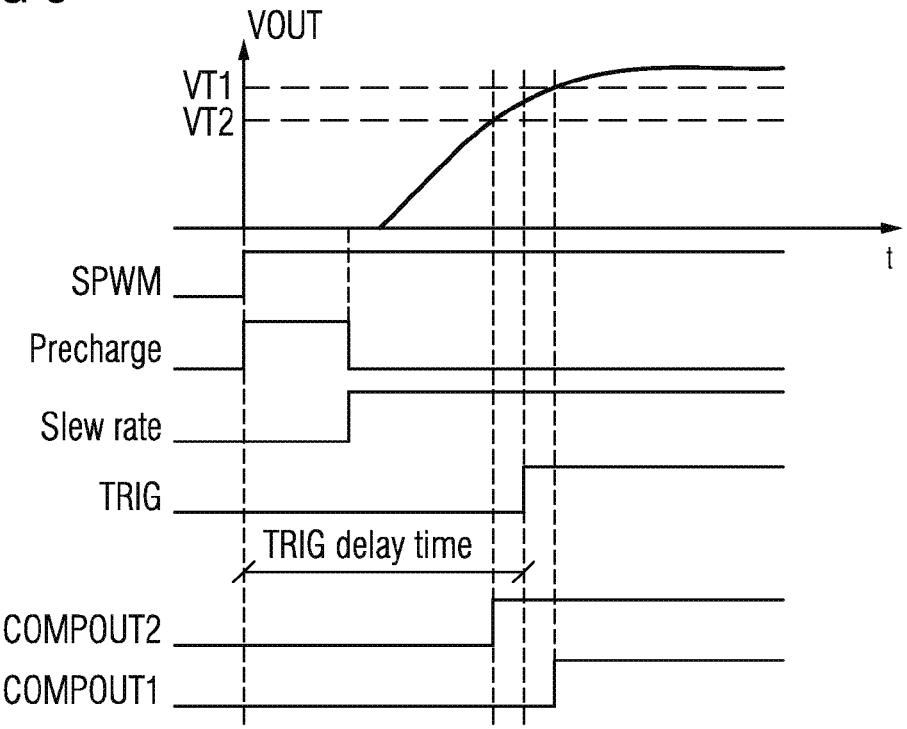
FIG. 5 is a timing diagram for a switching-on operation like that in FIG. 3 showing a calibration trigger signal and two comparator outputs.
Figure 6:
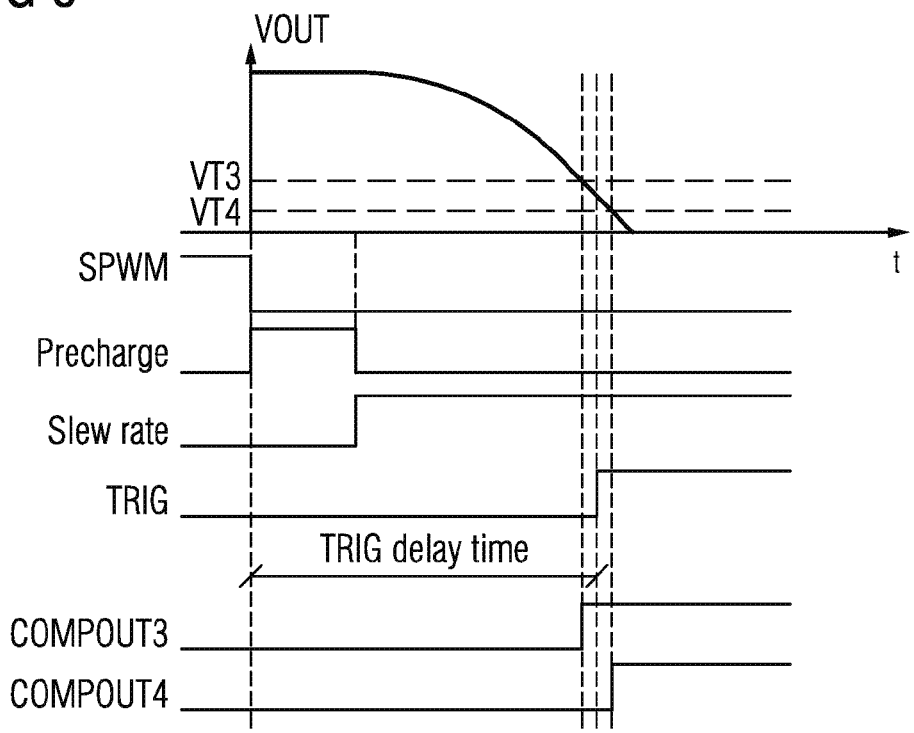
FIG. 6 is a timing diagram for a switching-off operation like that in FIG. 4 showing a calibration trigger signal and two comparator outputs.
Figure 7:
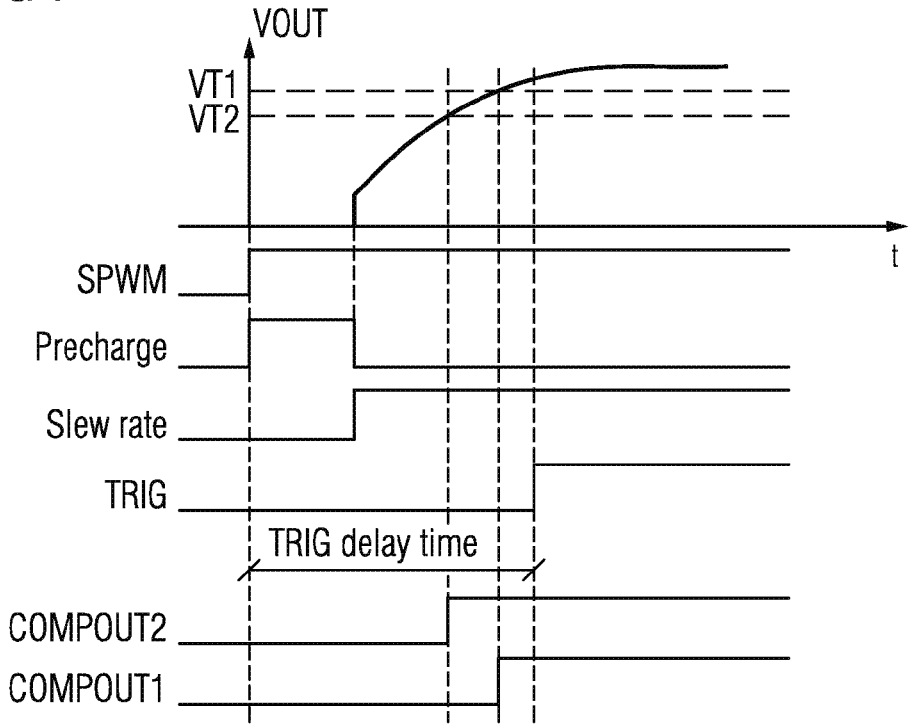
FIG. 7 is a timing diagram for a switching-on operation like that illustrated in FIG. 5 showing the effect of incorrect pulse width modulation control parameters (precharge is too high)
Figure 8:
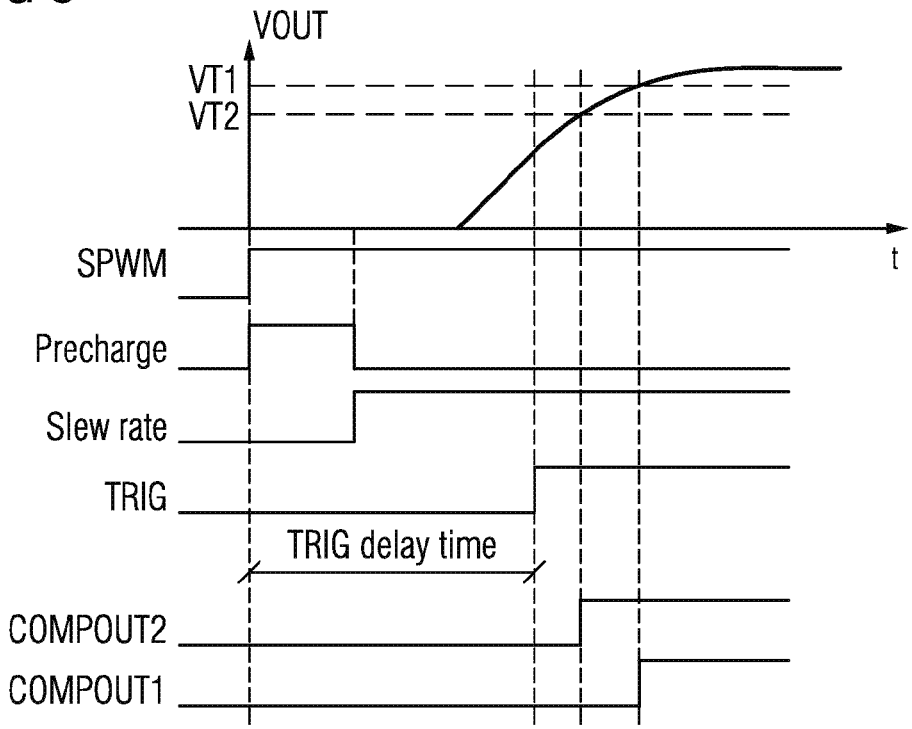
FIG. 8 is a timing diagram for a switching-off operation like that illustrated in FIG. 5 showing the effect of incorrect pulse width modulation control parameters (control parameters) (precharge is too low).

The switch controller 30 includes components for generating the sequence of control signals included in control signal SCONTROL and for applying the generated control signals SCONTROL to the control terminal of the semiconductor switching element S. These components will be discussed in detail later in this document. The control signal SCONTROL has different predetermined control signal parameters for controlling switching-on and switching-off operation. These one or more predetermined control signal parameters define the time profile of the control signal SCONTROL. Referring to FIGS. 3 and 4, as illustrated, each switching operation comprises a first precharge phase and a second slew rate phase for each of the rising and falling switching slopes (time profiles) of the control signals SCONTROL. In various implementations, the control signal parameters can be chosen, by non-limiting example, to establish a duration and/or signal intensity during the precharge phase and a duration and/or signal intensity during the slew rate phase, or any other aspects of the time profile of the control signal SCONTROL.

Referring to FIG. 2, the switch controller 30 includes control logic 34 with a driver arrangement 36 having a gate driver 36-1 and a charge pump unit 36-2 that are used to generate the control signal SCONTROL and to apply the control signal to the control terminal. Memory 38 is also operatively coupled with the control logic 34.

Referring to FIGS. 3 and 4 illustrate an implementation of a timing of PWM signals with respect to a switching-on operation (FIG. 3) and a switching-off operation (FIG. 4). FIG. 4 illustrates a situation where a turn-on command has been applied to the control logic 34 (PWM signal SPWM turns to high or on). In response, the control signal SCONTROL is generated with a time profile having 1) a relatively high current during the first precharge phase in order to achieve a short turn-on delay time thereby minimizing switch device stress in case of overload, and 2) a relatively low current during the second slew rate phase in order to achieve a desired switching slope and thereby an EMC-compliant switching operation. The signals Precharge and Slew rate in FIG. 3 show the relative timing of this sequencing of the two phases. When SPWM turns on to high or on, the precharge phase begins (signal Precharge turns onto high or on). When the precharge phase ends (signal Precharge goes to low or off), the slew rate phase begins (signal Slew rate goes to high or on). The resulting voltage out of the switch (VOUT) over time follows a switching slope, as illustrated in FIG. 3 by the curve of a voltage VOUT across the load path.

Referring to FIG. 4, an analog timing of a similar sequence of two phases (Precharge and Slew rate) is illustrated when SPWM turns to low or off. While the switching slope of the VOUT curve over time only depends on the current during the slew rate phase, the temporal position of the start of the VOUT switching slope with respect to the switching delay time depends on the amount of precharge applied to the gate. As illustrated in FIG. 4, an theoretical (desired) switching operation is characterized by a certain temporal position of the start of the switching slope (shortly after the beginning of the slew rate phase). In this case, a corresponding time profile of the control signal SCONTROL can be defined by one or more predetermined control signal parameters which determine, by non-limiting example, the duration and/or the intensity of the control signal value within the respective Precharge and Slew rate phases.

In the following section of this document, the operation of implementations of the system 10 is discussed, particularly how the system 10 operates to handle the situation that each switching process depends not only on the time profile of the control signal, but also on the application parameters (operating conditions).

In the system 10, the microcontroller 20 receives a plurality of operation condition parameters determined by measurements. As illustrated, these operation condition parameters are, by non-limiting example, an actual temperature OCT in an environment of the system (e.g. a temperature inside or outside the vehicle), an actual supply voltage OCV provided by an electrical supply system of the vehicle, and an actual load current OCI provided by the electrical supply system of the vehicle. Any of a wide variety of other external variables or load-related variables could be used in various implementations.

The parameters OCT, OCV, OCI are provided to the microcontroller 20 through various corresponding measurement devices, such as, by non-limiting example, sensors, thermocouples, voltage meters, current meters, and so forth. For an at least partial compensation of the influence of the operation conditions (for example, actual temperature, actual supply voltage, and actual load current) on the switching behavior of the semiconductor switching element S, the system 10 is designed to generate/calculate one or more control parameters used in the control signal SCONTROL based on a digitally stored model that provides the one or more control parameters that are related to the operating condition parameters OCT, OCV, OCI.

In such implementations, the microcontroller 20 includes a digital store (memory) 22 for storing the digital model. In particular implementations, the switch controller 30 also has a digital store (memory) 38 for storage of the one or more control parameters generated by the microprocessor 20. In these implementations, the use of the memory 38 may enable the switch controller 30 to have very fast access on the one or more control parameters when generating the control signal SCONTROL. In various implementations, as illustrated, the memory 38 is coupled with the control logic 34 of the switch controller 30.

During operation of the system 10, the control logic 34 accesses the content of the memory 38 to locate the one or more control parameters, for use in generating the control signal SCONTROL. The microcontroller 20 accesses the memory 38 to write or updating the values of the one or more control parameters to be used by the control logic 34. The microcontroller 20, which includes memory 22 in which is stored the digital model, uses the model to generate the one or more control parameters based on the digital model and the operating condition parameters OCT, OCV, OCI. The microcontroller 20 then transmits the one or more determined control parameters via an interface 40 of a bus system (such as a serial peripheral interface (SPI) bus) to the control logic 34, for the control logic 34 to write or update to the memory 38. In other implementations, the microcontroller 20 may use the interface 40 to write the one or more control parameters directly to the memory 38. Upon initial startup, the one or more control parameters can be predetermined to create a desired initial switching operation behavior of the controlled semiconductor switch S and then programmed (stored) into the memory 38 of the switch controller 30 prior to a first activation of the switching element S.

In various implementations, the digital model is included in the memory 22. As part of the digital model or as the entire digital model, the digital model includes a look-up table that includes one or more model parameters. In various implementations, these one or more model parameters may be the same as one or more of the control parameters and/or they are used for generating/calculating the one or more control parameters. In particular implementations, all needed control parameters may be directly provided by retrieving them from the look-up table. In other implementations, at least one control parameter is not directly retrieved from the look-up table, but calculated using the digital model from one or more retrieved model parameters. In such implementations, the stored model may also include one or more equations defining a relationship between the operating condition parameters and the corresponding suitable one or more control parameters, where the retrieved model parameters are equation parameters. Accordingly, based on the one or more equations and using the retrieved equation parameter(s), the microcontroller is able to perform a calculation of suitable control parameter(s). Where implementations of the digital model contain or are a look-up table, a savings in calculation resources by the microcontroller 20 and/or the control logic 34 may result.

System 10 implementations like those disclosed herein implement feedforward control rather than just closed loop feedback control because the microcontroller 20 uses both the operating condition parameters (OCT, OCV, OCI, etc.) along with the one or more model parameters to calculate the one or more control parameters that the control logic 34 then uses to generate the control signal SCONTROL. Because the operating condition parameters are considered, the system 10 does not have to operate merely reactively but can operate proactively by altering the control parameters to ensure, based on the digital model, that the semiconductor switch S will operate in such a way to provide the desired output voltage VOUT to the load L. The use of feedforward control may permit system 10 implementations to operate with less variance across a wide variety of operating conditions and load conditions and better protect the semiconductor switch S from damage.

In particular implementations, system 10 may include a monitoring/calibrating capability. In various implementations, the switching operation can be monitored on demand or on an as-needed basis. This capability of these system implementations allows the system 10 to adapt the stored digital model to increase the potential for the occurrence of correct (theoretical) switching behavior. Such capability is additional to the feedforward digital model systems previously described. In system 10 implementations that include it, a calibration unit 50 is included to provide this function as illustrated in FIG. 2. The calibration unit 50 determines a deviation between a predetermined theoretical switching behavior of the semiconductor switch S and the actual/observed switching behavior of the semiconductor switch S and then provides feedback on the deviation to the microcontroller 20 which adjusts the digital model accordingly. As illustrated, the calibration unit 50 is designed to determine whether an actual voltage VOUT across the load path (output voltage) at a predefined instant with reference to the time profile of the control signal SCONTROL lies within a predefined voltage window.

In implementations, the calibration unit 50 includes one or more of any of a wide variety of passive and active electrical components which are designed to assist the calibration unit 50 will evaluating the voltage, current, or any other desired parameter of the output of the semiconductor switch S. In particular implementations, as illustrated, the active electrical components may be semiconductor devices such as diodes, transistors, integrated circuits, optoelectronics, comparators, multiplexers, and any other device that relies on a source of energy. As illustrated, the active components include a rising edge window comparator 52 for comparing the output voltage VOUT with a predefined upper threshold voltage VT1 and a predefined lower threshold voltage VT2. In various implementations, a falling edge window comparator 54 for comparing the output voltage VOUT with a predefined upper threshold voltage VT3 and a predefined lower threshold voltage VT4 may also be included. In other implementations, the passive electrical components may be resistors and other passive components such as, by non-limiting example, capacitors, sensors, and any other component that does not introduce energy into a circuit. As illustrated, the unit 50 also includes a chain of resistors R1 to R5 arranged parallel to the load path of the switching element S, so that the predefined upper threshold voltages VT1, VT3 and the predefined lower threshold voltages VT2, VT4 are provided at pickoffs of the chain of resistors R1 to R5 as illustrated in FIG. 2. The unit 50 also includes an encoder logic 56 that includes a sample-and-hold stage configured to output a result of the determined deviation and generate a status signal STAT.

In other implementations, only a single comparator may be used that is coupled to a multiplexed reference from a multiplexer. In various implementations, the system could use a digital input signal to the comparator as a first event to begin a first comparison (quantification) process and then use a subsequent analog input signal as a second event to begin a second comparison. While two comparisons have been discussed, more than two could be used and any combination of digital only, analog only, or both digital and analog signals could be utilized in various implementations. The outputs from the single comparator that contain the results of the first comparison and the second comparison are then provided to the encoder logic 56.

The microcontroller 20 is programmed to change the digital model stored in the memory 22 coupled to the microcontroller 20 when the actual output voltage VOUT at the predefined instant lies outside of the predefined voltage window using data values included in the status signal STAT. A calibration of the digital model is initiated by the encoder logic 56 receiving a calibration trigger signal TRIG, which may be, in various implementations, communicated from the control logic 34 of the switch controller 30. The encoder logic 56 then creates data values that represent the result of the determined deviation for the output voltage(s) during a switching-on operation (switching-on output) and/or during a switching-off operation (switching-off output) upon receipt of the calibration trigger signal TRIG. These data values include information about the outputs (see "COMPOUT1" to "COMPOUT4" in FIGS. 5 to 8) of the comparators 52, 54 which are included in the status signal STAT. The microcontroller 20 receives the status signal STAT via the interface 40.

In various implementations, the generation (and consequently receiving) of the calibration trigger signal TRIG is provided on a sample basis, initiated by the microcontroller 20. In these implementations, the microcontroller 20 determines the instances (predetermined or random time intervals) at which the calibration trigger signal TRIG is to be generated. In other implementations, the microcontroller 20 may generate the calibration trigger signal TRIG on a periodic time interval, but at an interval less than every switching cycle of the semiconductor switch S. In such implementations, the microcontroller 20 does not generate the calibration trigger signal TRIG after every switching cycle of the semiconductor switch S. In other implementations, the microcontroller 20 may generate the calibration trigger signal TRIG on an as-needed basis rather than a scheduled basis, for example, when a deviation between the desired output voltage value or time characteristic is detected by the microcontroller 20. In other implementations, the microcontroller 20 may generate the calibration trigger signal TRIG at an interval equivalent to every switching cycle of the semiconductor switch S but make adjustments to the model and/or control parameters only if a deviation is detected in the voltage related data in the status signal STAT. In the various implementations, the microcontroller 20 is configured to communicate a command signal for initiating the generation of the calibration trigger signal TRIG via the SPI interface 40 to the control logic 34.

During the calibration assessment process, the system 10 conducts a detection of the correct slope position in the output voltage VOUT by using the calibration unit 50, which in as illustrated samples the output voltage VOUT slope with the window comparators 52, 54 configured for each of the rising and falling switching slopes. When the amount of precharge is set correctly, the output voltage VOUT is within the desired output voltage range (see FIGS. 5 and 6). Where the amount of precharge is set too high, the output voltage VOUT is higher than the desired output voltage range (see FIG. 7). Where the amount of precharge is set too low, the output voltage VOUT is lower than the de-sired output voltage range (see FIG. 8).

The microcontroller 20 checks the detection results of the slope calibration process by SPI communication of the status signal STAT. Based on the data values relating to the output voltage in the status signal STAT (which communicate a trigger before/within/after a relative output voltage window), the microcontroller 20 adjusts the digital model for the actual operation conditions. In various situations, this may result, for example, so that for the same actual operation conditions the amount of precharge is adjusted in order to have the desired switching delay. The adjustment of the amount of precharge can be realized by changing the duration and/or intensity (e.g. current) of the control signal value within the precharge phase.

In implementations where the microcontroller 20 generates the calibration trigger signal on its own initiative, the generation of the calibration trigger signal TRIG may be initiated based on an analysis of one, any, or all of the operating condition parameters OCT, OCV, OCI and/or the development of these operating condition parameters OCT, OCV, OCI over a period of time. After analyzing the operating condition parameters, the microcontroller 20 checks whether a calibration of the model in regard of these particular operation condition parameters took already place within a predetermined past time period. If so, a calibration may not be initiated. Otherwise, a calibration is initiated by communicating the command signal and thus generating the calibration trigger signal TRIG.

The microprocessor 20, when changing the digital model, may also, in particular implementations, provide a data signal for changing the control parameters stored in the memory 38 of the control logic 34. In various implementations, all or some of the model parameters or the digital model may be stored in the memory 38. In various implementations, as described, the changing of the digitally stored model based on the determined deviation comprises changing at least one of one or more model parameters (which may be equation parameters) in the digital model and/or in the look-up table when the actual output voltage VOUT at the predefined instant lies outside of the respective predefined voltage window. As illustrated in the figures the voltage window used in the evaluation of a rising edge control signal SCONTROL (i.e. for switching-on operation) is predefined by the interval [VT1, VT2], whereas the voltage window used in the evaluation of a falling edge control signal SCONTROL (i.e. for switching-off operation) is predefined by the interval [VT3, VT4].

Implementations of systems 10 like those disclosed in this document may achieve stable switching timing where the semiconductor switching element delivers more or less constant switching-on and switching-off delay times. This may have the effect of not deteriorating the output duty cycle to the load L. Furthermore, a switching element overload condition may be able to be detected quite early after the activation of a PWM switching sequence due to the known timing of the switching operation, which significantly limits and prevents stress inside the switching element. Various implementations may also have the advantage that as the initial control parameter(s) can be stored in a non-volatile memory external or internal to the system 10, the timing may be set approximately properly coincidentally with first switching-on of the switching element without requiring the passing of the settling time required in a closed loop system.

In places where the description above refers to particular implementations of pulse width modulated control systems and implementing components, sub-components, methods and sub-methods, it should be readily apparent that a number of modifications may be made without departing from the spirit thereof and that these implementations, implementing components, sub-components, methods and sub-methods may be applied to other pulse width modulated control systems and various components.

What is claimed is:

1. A pulse width modulated controller system for a semiconductor switch, the system comprising:
a microcontroller coupled with a memory;
a switch controller coupled with the microcontroller; and
a calibration unit, the calibration unit comprising:
at least two comparators, one or more passive electrical components, and an encoder logic all operatively coupled together and coupled with the microcontroller and with the switch controller;
wherein the microcontroller is configured to send a calibration trigger signal to the encoder logic of the calibration unit, and, in response, the calibration unit is configured to:
using a first one of the at least two comparators, generate a first comparator output for a switching-on operation of the semiconductor switch;
using a second one of the at least two comparators, generate a second comparator output for a switching-off operation of the semiconductor switch;
generate a status signal using the encoder logic using one of the first comparator output, the second comparator output, and both the first comparator output and the second comparator output; and
send the status signal to the microcontroller;
wherein the one or more comparators and the one or more passive electrical components are electrically coupled with a supply voltage to the semiconductor switch and with an output voltage from the semiconductor switch;
wherein the memory coupled to the microcontroller comprises a digitally stored model comprising one or more control parameters for generating a control signal for the semiconductor switch; and
wherein the microcontroller is configured to receive one or more operating condition parameters, and, using one or more operating condition parameters and the digitally stored model, to generate control parameters for generating the control signal for the semiconductor switch.

2. The system of claim 1, wherein the switch controller comprises a control logic and a memory operatively coupled together and operatively coupled with the semiconductor switch.

3. The system of claim 1, wherein the memory coupled to the microcontroller comprises a look-up table comprising one or more model parameters for use by the microcontroller to calculate one or more control parameters for generating a control signal for the semiconductor switch.

4. The system of claim 1, wherein the microcontroller is further configured to, in response to receiving the status signal, adjust one or more of the one or more control parameters of the digital model stored in the memory coupled to the microcontroller.

5. The system of claim 1, wherein the microcontroller is configured to generate the calibration trigger signal on a predetermined time interval.

6. The system of claim 1, wherein the microcontroller is configured to generate the calibration trigger signal after analyzing one of a current value of one or more operating condition parameters and a development of values of one or more operating condition parameters over a period of time.

7. The system of claim 1, wherein the microcontroller is not configured to generate the calibration trigger signal after each switching operation of the semiconductor switch.

8. The system of claim 1, wherein the switch controller further comprises a serial peripheral interface (SPI), a gate driver, and a charge pump unit all operatively coupled together and operatively coupled with the semiconductor switch.

9. A pulse width modulated controller system for a semiconductor switch, the system comprising:
  a microcontroller coupled with a memory, the memory comprising a look-up table comprising one or more model parameters;
  a switch controller coupled with the microcontroller and with a semiconductor switch, the switch controller comprising a control logic;
  a calibration unit, the calibration unit comprising:
    at least two or more comparators, one or more passive electrical components, and an encoder logic all operatively coupled together and coupled with the microcontroller and with the switch controller;
  wherein the microcontroller is configured to send a calibration trigger signal to the encoder logic of the calibration unit, and, in response, the calibration unit is configured to:
    using a first one of the two or more comparators, generate a first comparator output for a switching-on operation of the semiconductor switch;
    using a second one of the two or more comparators, generate a second comparator output for a switching-off operation of the semiconductor switch;
    generate a status signal using the encoder logic using one of the first comparator output, the second comparator output, and both the first comparator output and the second comparator output; and
    send the status signal to the microcontroller;
  wherein the one or more comparators and the one or more passive electrical components are electrically coupled with a supply voltage to the semiconductor switch and with a load voltage from the semiconductor switch; and
  wherein the microcontroller is configured to receive one or more operating condition parameters, and, using one or more operating condition parameters and the look-up table, to generate control parameters for generating the control signal for the semiconductor switch.

10. The system of claim 9, wherein the microcontroller is further configured to, in response to receiving the status signal, change one or more of the one or more model parameters comprised in the look-up table stored in the memory coupled to the microcontroller.

11. The system of claim 9, wherein the microcontroller is configured to generate the calibration trigger signal on a predetermined time interval.

12. The system of claim 9, wherein the microcontroller is configured to generate the calibration trigger signal after analyzing one of a current value of the one or more operating condition parameters and a development of values of the one or more operating condition parameters over a period of time.

13. The system of claim 9, wherein the microcontroller is not configured to generate the calibration trigger signal after each switching operation of the semiconductor switch.

14. A method of controlling a semiconductor switch, the method comprising:
  storing one or more model parameters in a look-up table comprised in memory coupled with a control logic and with a microcontroller;
  receiving one or more operating condition parameters using the microcontroller;
  in response to receiving one or more operating condition parameters, retrieving one or more of the one or more model parameters in the look-up table and generating one or more control parameters using the microcontroller and using the one or more operating condition parameters;
  generating a control signal for a semiconductor switch using the one or more control parameters and the control logic;
  providing a calibration trigger signal to a calibration unit using the microcontroller;
  in response to receiving the calibration trigger signal, evaluating a switching-on operation of the semiconductor switch using one or more comparators and one or more passive electrical components comprised in a calibration unit coupled with the microcontroller by generating a switching-on output through comparing a value of an output voltage from the semiconductor switch with a predetermined switching-on voltage;
  in response to receiving the calibration trigger signal, evaluating a switching-off operation of the semiconductor switch using the one or more comparators and the one or more passive electrical components comprised in the calibration unit coupled with the microcontroller by generating a switching-off output through comparing a value of the output voltage from the semiconductor switch with a predetermined switching-off voltage;
  using an encoder logic comprised in a calibration unit coupled with the microcontroller to generate a status signal using one of the switching-on output, the switching-off output, and both the switching-on output and the switching-off output;
  sending the status signal to the microcontroller;
  in response to receiving the status signal, evaluating whether the data representing the output voltage in the status signal is outside a predetermined voltage window using the microprocessor; and
  if the output voltage is outside the predetermined voltage window, changing one or more of the one or more model parameters comprised in the look-up table comprised in the memory coupled to the microcontroller using the microcontroller in response to receiving the calibration signal.

15. The system of claim 14, wherein the microcontroller is configured to provide the calibration trigger signal after analyzing one of a current value of the one or more operating condition parameters and a development of values of the one or more operating condition parameters over a period of time.

16. The system of claim 14, wherein the microcontroller is not configured to provide the calibration trigger signal after each switching operation of the semiconductor switch.

* * * * *